United States Patent [19]

Ban

[11] 4,401,689
[45] Aug. 30, 1983

[54] RADIATION HEATED REACTOR PROCESS FOR CHEMICAL VAPOR DEPOSITION ON SUBSTRATES

[75] Inventor: Vladimir S. Ban, Hopewell, N.J.

[73] Assignee: RCA Corporation, New York, N.Y.

[21] Appl. No.: 201,437

[22] Filed: Oct. 28, 1980

Related U.S. Application Data

[62] Division of Ser. No. 117,236, Jan. 31, 1980, Pat. No. 4,263,872.

[51] Int. Cl.³ .......................... B05D 3/02; B05D 3/14
[52] U.S. Cl. .................................... 427/45.1; 427/50; 427/51; 427/55; 427/248.1; 427/255.5; 427/255
[58] Field of Search ............... 427/82, 83, 85, 86, 427/89, 91, 93–95, 248.1, 50, 255, 253, 249, 252, 250, 251, 255.1–255.7, 51, 45.1; 118/715, 721, 724, 725, 728–730, 500, 502, 503; 148/174, 175, 189

[56] References Cited

U.S. PATENT DOCUMENTS

| | | | |
|---|---|---|---|
| 2,936,246 | 5/1960 | Coghill | 118/725 |
| 3,226,254 | 12/1965 | Reuschel | 118/725 |
| 3,460,510 | 8/1969 | Currin | 118/725 |
| 3,645,230 | 2/1972 | Hugle et al. | 118/730 |
| 3,922,467 | 11/1975 | Pinchon | 427/255.5 |
| 3,934,060 | 1/1976 | Burt et al. | 118/728 |
| 4,062,318 | 12/1977 | Ban et al. | 118/730 |
| 4,082,865 | 4/1978 | Ban et al. | 427/255 |
| 4,096,822 | 6/1978 | Yamawaki et al. | 118/729 |
| 4,098,223 | 7/1978 | Ertl et al. | 118/725 |
| 4,108,106 | 8/1978 | Dozier | 427/82 |

FOREIGN PATENT DOCUMENTS 480040 11/1975 U.S.S.R. .............................. 118/730

*Primary Examiner*—S. L. Childs
*Attorney, Agent, or Firm*—Birgit E. Morris; Donald S. Cohen; Joseph D. Lazar

[57] ABSTRACT

A method of chemically vapor depositing a material on a plurality of stacked substrates comprising heating a tubular susceptor surrounding the stack to thereby heat the substrates by radiant heating.

5 Claims, 7 Drawing Figures

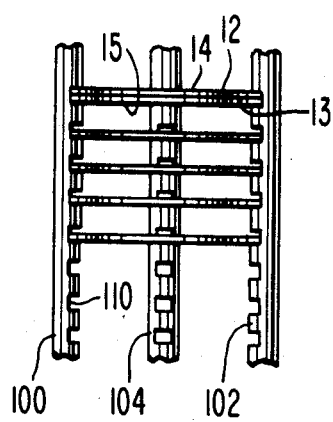
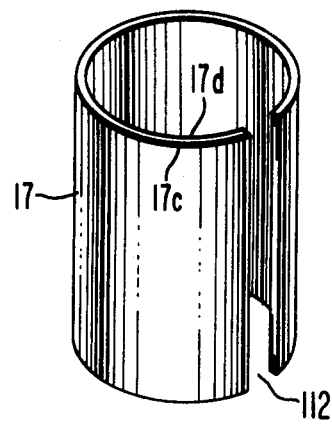
Fig. 3.  Fig. 4.
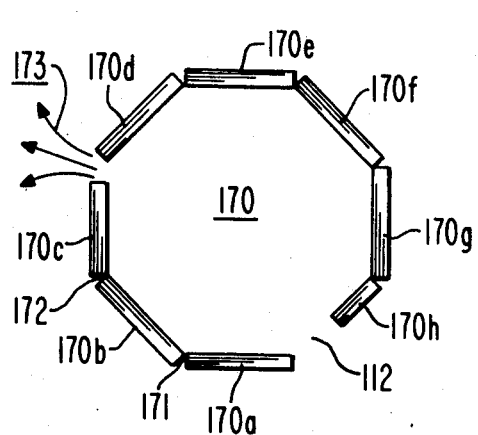
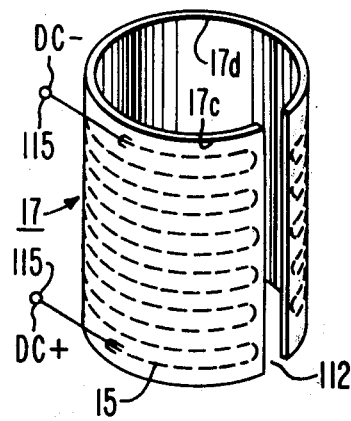
Fig. 5.  Fig. 6.
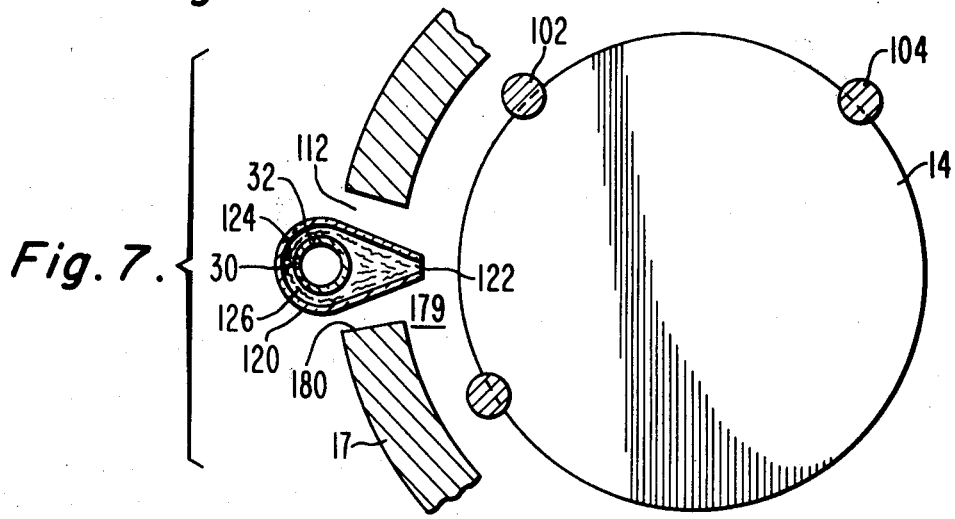
Fig. 7.

RADIATION HEATED REACTOR PROCESS FOR CHEMICAL VAPOR DEPOSITION ON SUBSTRATES

The invention relates to a reactor for chemically vapor-depositing a material onto surfaces of a plurality of substrates within a reaction chamber utilizing radiative heating.

Chemical vapor deposition (CVD) is a method of forming a layer of material on a substrate, such as an epitaxial layer on a silicon wafer, wherein deposits are produced by heterogeneous gas-solid or gas-liquid chemical reactions at the surface of the substrate. A volatile compound of the element or substance to be deposited is introduced and thermally decomposed, or reacted with other gases or vapors, at the surface of the substrate to yield non-volatile reaction products which deposit on the substrate surface. Chemical vapor-deposition of epitaxial films on silicon wafers are typically performed at high temperatures (1000°-1200° C.) in reaction chambers wherein the wafers are supported and heated on graphite susceptors.

Various types of susceptors have been utilized for supporting substrates during the chemical vapor-deposition process.

A susceptor structure for a number of stacked parallel graphite discs for carrying silicon wafers on one or both sides of the discs is described in U.S. Pat. Nos. 4,062,318, issued Dec. 13, 1977 entitled "Apparatus for Chemical Vapor Deposition", and 4,082,865 issued Apr. 4, 1978, entitled "Method for Chemical Vapor Deposition". The susceptor structure is enclosed within a quartz tube surrounded by an RF induction heating coil. A gas manifold is provided with a plurality of gas nozzles for the injection of gas into peripheral portions of the stacked discs. The manifold and thus the nozzles are oscillated to spread the gas plume more uniformly over the surface of the discs and the wafers carried on the disc. The RF coil inductively heats the graphite discs by inductive process through the wall of the quartz tube.

The susceptor discs in such a system, however, cause certain problems. Since the RF energy is preferentially coupled from the coil to the peripheral portions of the graphite disc, large thermal gradients can exist within the graphite disc. Such thermal gradients can result in several undesirable effects. First, the wafers supported on the discs will be heated unevenly resulting in thickness and doping non-uniformity in the final wafer. Furthermore, crystalline defects such as "slips" may occur in the wafer. Second, silicon carbide (SiC) coatings of the graphite disc may crack due to the uneven expansion at various locations on the disc.

Furthermore, the susceptor discs themselves occupy valuable space within the susceptor structure and thereby reduce the substrate (wafer) capacity of the reactor.

According to the present invention, a CVD reactor comprises a plurality of substrates positioned within a chamber having walls formed of susceptor material. The susceptor walls serve as a radiant source of heat to the substrates within the chamber. Gas, preferably from oscillating nozzles, is directed between the substrate and substantially over the entire surface of each substrate.

Heating the susceptor material is achieved by RF induction coils or resistance heating coils surrounding the susceptor chamber walls:

In the drawing:

FIG. 3 is a cross-sectional view of the gas distribution manifold showing an alternative embodiment of the invention;

FIG. 4 is a schematic of the susceptor tube in cylindrical form; FIG. 5 is a schematic of one view of an alternative embodiment of the tubular susceptor in which the tube is an octahedron;

FIG. 6 is a schematic showing the arrangement of the susceptor tube utilizing resistance heating coils; and FIG. 7 is a fragmentary schematic of a modified form of the gas feeding means.

Figure 1:
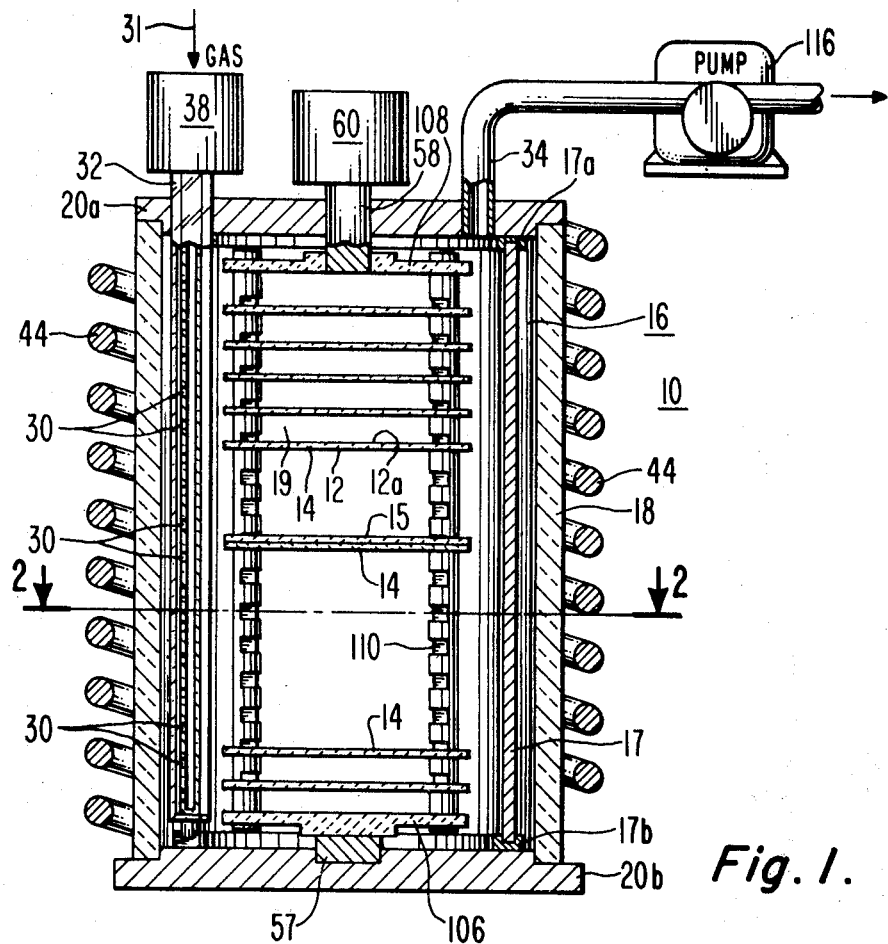
FIG. 1 is a partial, cross-sectional view taken along viewing line 1—1 of FIG. 2 illustrating one embodiment of the present invention.
Figure 2:
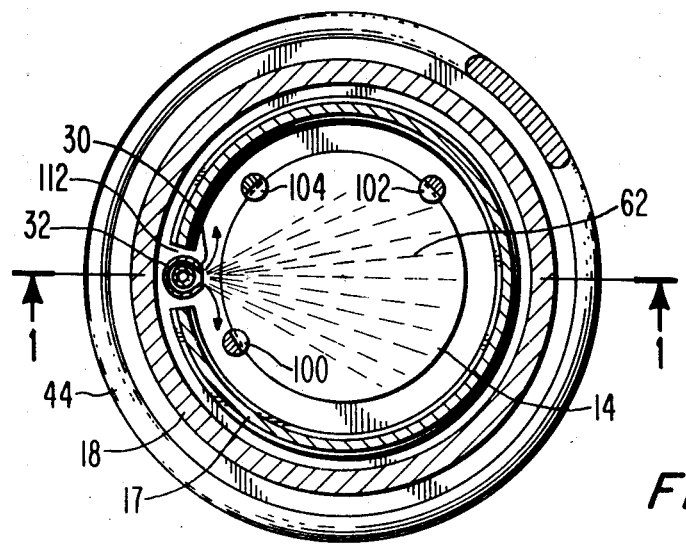
FIG. 2 is a cross-sectional view taken along viewing line 2—2 of FIG. 1.

Apparatus 10 as shown in FIGS. 1 and 2 includes a cylindrical quartz housing 18 defining a chamber 16 serving to contain reactant gases and heat. Housing 18 also serves as a means to support RF induction coil 44. Positioned in the chamber 16 is a tubular structure 17, generally cylindrical serving as a susceptor which, when heated, provides radiant heat to the space within the tube 17.

The susceptor tube 17, a separate view of which is shown in FIG. 4, is formed of material such as graphite or silicon carbide with a wall thickness of about one centimeter and a tube diameter of about 7 to 15 cm, depending on the size of wafers 14 used. The susceptor tube when heated by RF energy or an electrical resistance heat coil, will serve as a source of radiant energy for heating wafers 14 positioned within the chamber.

Within tube 17 is disposed three rods 100, 102 and 104 mounted on brackets 106 and 108 which, in turn, are attached to rotatable shafts 57 and 58 being driven by a motor 60. Each of the rods 100-104 is notched to provide grooves 110 as shown in FIG. 3 providing a sufficient opening to support the peripheral portions of substrates 14, typically in wafer form, of the type useful in practicing the present invention. Furthermore, the rods are spaced so that the wafers may be inserted and removed easily. The rods 100-104 are preferably made of material which is both structurally strong and chemically inert in the presence of whatever gases may be provided to the reaction chamber 16. Typically molybdenum, SiC, or graphite can be used for the rods 100-104 in processes where silicon is the material that is to be chemically vapor-deposited. In the present embodiment, although three rods (100, 102, 104) are preferably used to provide a stable support for the plurality of wafers 14 that are being processed, additional rods may be used as desired, to meet the requirements of the reactor apparatus to be utilized.

A plurality of wafers (14) are positioned within the rods 100-104 in the respective grooves to provide a stack-like arrangement. Each of the wafer 14 is separated by a distance of about four mm to a distance of about ten mm. The spacing of the wafers is a matter of choice depending upon the capacity of the reaction chamber desired and other parameters of efficiency well known in the art.

With such an arrangement the material according to the CVD process in the practice of this invention will be deposited on both surface 12 and 12a of the substrates 14. However, if desired, two substrates 14 and 15 (as shown in FIGS. 1 and 3) may be mounted within the same set of grooves 110 such that only the surface of each of the substrates exposed to the CVD material will have material deposited thereon.

The reaction chamber 16 provides the environment for chemically vapor-depositing (CVD) a material derived from a gas or vapor carried into the chamber on the surfaces 12 and 12a of the substrates 14.

The quartz tube 18 is closed at each end by metallic end sections 20 and 20b. The susceptor tube 17 is maintained in position by annular ring members 17a and 17b suitable fixed to the metallic end sections 20a and 20b.

An induction coil 44 is wound about the outer surface of quartz tube 18 and connected to a suitable source of RF energy (not shown) for generating a source of RF energy for heating the susceptor tube 17 by induction. The frequency of the RF signal used to energize the coil 44 is typically 450 kHz. Frequencies as low as 10 kHz may be used for the purpose of developing induced eddy currents in the walls of the susceptor tube 17 at a greater depth than occurs for higher frequencies. The use of lower frequencies such as 10 kHz may be needed if the walls of the susceptor tube 17 are thick.

As shown in FIG. 4, the susceptor tube 17 in the preferred cylindrical form is provided with a slit 112 for receiving the gas flow apparatus to be described. Because of the slit 112, eddy currents generated by the RF-induced currents from the coils 44 (FIG. 1) will be developed not only on the outer surface 17b of the tube, but also on the inner surface 17c. As a result, the susceptor tube 17 will be a more efficient source of heat for the wafers 14 by radiation. One of the problems of the prior art systems as mentioned above is that temperature gradients develop across the substrates if the heat is not uniform. Crystalline defects known as "slips" are caused by non-uniform heating. According to the present invention, the substrates 14 can be stacked very densely within the chamber of the tube 17 and in close proximity to the inner wall 17c of the tube to provide very efficient transfer of heat whereby a uniform heating of the substrates is effected.

In an alternative embodimet, resistance heating coils 45 are suitably embedded in the outer surface 17b in a meandering or serpentine fashion as shown in FIG. 6 and connected to a suitable power source as at terminals 114 and 115, respectively. Electrical current (a.c. or d.c.) is applied to the coil whereby the susceptor material of the tube 17 is heated to provide a source of radiant energy for heating the substrates 14.

Apparatus 10 is further provided with means of providing the gas or vapor carrying the material for vapor deposition. Various forms of such means may be used according to the desired conditions of operation. One such means comprises, as shown in FIGS. 1 and 2, a plurality of gas nozzles 30 connected to a source of gas as shown by arrow 31, to a common inlet pipe (manifold) 32 through which the gas is introduced. The nozzles 30 are suitably formed on the manifold 32 and positioned within the tubular structure 17 so that the flow of gas from the nozzles is directed, respectively, into the spacings 19 between the opposed surfaces of adjacent substrates 14 (or 15, if stacked in back-to-back relationship). Preferably, manifold 32 is positioned within slot 112 (FIGS. 2 and 4) positioned so that the nozzles 30 face inwardly to direct gas over the substrates 14. The shape of the nozzles 30 may be of any suitable design including a cone-shaped structure or simply an aperture in the form of a circular hole or slit formed in the wall of the manifold 32. An outlet pipe 34 is provided to remove reaction gases from within the reaction chamber 16.

In certain applications, it may be desirable to maintain the pressure of the gas within the chamber 16 below atmospheric pressure. For such purposes a pump 116 is provided in the outlet pipe for developing sub-atmospheric pressures. Any suitable means for developing such sub-atmospheric pressure may be used for this purpose.

In the preferred embodiment, apparatus 10 is further provided with means for oscillating the nozzles 30 in azimuthal direction so that the flow of gas therefrom is directed over the surfaces 12 of the substrates 14. In the structure shown in FIG. 1, such oscillating means includes a sweep motor 38 connected to manifold 32 and arranged to sweep the nozzles 30 back and forth azimuthally in an arc sufficiently to provide a flow of gas over the entire surfaces of the respective substrates 14 (and 15) as shown by lines 62 in FIG. 2. The sweep is such as to be either linear or non-linear. In the non-linear mode, the sweep can be controlled as by a cam, not shown, so as to dwell the flow of gas over different desired portions of the surface of the substrate.

The apparatus 10 is preferably used for chemical vapor-depositing epitaxial layers of silicon on the surfaces 12 of the substrates 14 which are typically silicon wafers. The stacked substrates 14 are radiantly heated by the heated susceptor tube 17 to a temperature sufficiently high enough to allow the CVD reaction to occur, typically in the range of 1100° C. to 1200° C. for depositing silicon epitaxial layers on the substrates 14.

Since the spacings between the surfaces 12 of the mounted substrates 14 are less than 10 millimeters, it is necessary to direct a flow of gas from the nozzles 30 into the spacings, in order to insure that gasoues reactants within the chamber 16 are uniformly delivered to all areas of the surfaces 12. The use of the nozzles 30 causes a much larger transfer of reactant gases across the surfaces 12, in comparison with the transfer in laminar flow which is typical of prior art methods. In the preferred embodiment, the gas nozzles deliver a gaseous mixture comprising a vaporized silicon bearing compound, such as silane ($SiH_4$), chlorosilane ($SiClH_3$), dichlorosilane ($SiCl_2H_2$), trichlorosilane ($SiCl_3H$) or silicon tetrachloride ($SiCl_4$), together with a carrier gas such as hydrogen ($H_2$) and also dopant gases if desired. A chemical reaction, such as pyrolysis or hydrogen reduction, at the surfaces 12 of the heated substrates 14, produces silicon which then deposits on the substrates 14. For more detailed information on the temperature and typical concentrations of the reactant gases, see U.S. Pat. No. 3,945,864 issued to Goldsmith et al. on Mar. 23, 1976 and assigned to RCA Corporation, which is incorporated herein by reference.

In embodiments wher the "nozzles" comprise simply a plurality of orifices or slits capable of projecting a flow of gas directly into the spacings between the surfaces 12, such as a manifold type of arrangement, uniform delivery of the gaseous mixture across the surface 12 is further improved by maintaining the pressure of the gas within the chamber 16 below atmospheric pressure by pump 116 as mentioned above. Preferably, the gaseous mixture is maintained at a pressure between about 1 torr and about 100 torr. For effective operation of CVD systems, it is necessary that the reactant gases diffuse through the boundary layer which forms adjacent to the exposed surfaces 12. The growth rate, uniformity of thickness, and doping level of the material being deposited on the surfaces 12 depends upon the efficient diffusion of gaseous reactants through this boundary layer. By lowering the pressure of the gas within the chamber 16, the mean free path of the gaseous molecules increases. At sufficiently low pressures, the mean free path approaches the thickness of the boundary layer, which then becomes less of a barrier to the transport of gaseous reactants to the surfaces 12. By utilizing reduced gas pressures in combination with the gas "nozzles" in reaction chambers where the substrates 14 are supported in a close stack-like relationship, uniform delivery of the gaseous mixture across the surfaces 12 is significantly improved. Such a low-pressure method also allows for the chemical vapor deposition of a material onto both sides of the substrates simultaneously. Reduced pressures would offer another advantage due to smaller heat losses in reaction chambers operating under such conditions. Consequently, one is able to more easily maintain proper temperatures and avoid unwanted temperature gradients.

In order to further ensure delivery of the gaseous reactance to all portions of the surfaces of the wafers, it is preferred that the wafers (substrates 14) be rotated by motor 60 during the CVD process as described above. Such rotation of the substrates results in deposited epitaxial layers of silicon which are significantly more uniform in thickness than when the substrates are not rotated. Preferably, the nozzles providing the flow of gas are oscillated in an arc so that the flow of gas is directed towards the spacings between the wafers in azimuth. By continuously sweeping the nozzles 30 back and forth, the flow of gas, as illustrated by dashed lines 62 in FIG. 2, is directed across the entire surface. This sweep motion in combination with the rotation of the substrates further ensures a uniform delivery of the gaseous reactants to the wafers making it possible to achieve a still higher level of uniformity in the thickness and doping of the material being deposited. Furthermore, still further control of the thickness of the material being deposited is achieved by varying the sweeping rate of the nozzles so that one or more dwells may be made to control the thickness of the deposited material. Thus, in some applications, it may be desirable to manufacture substrates having epitaxial layers with a particular thickness profile, which is not uniform in thickness.

The apparatus 10 of the present invention provides for significantly higher reactor capacity per unit volume since the substrates 15 can be closely spaced into a very dense packing configuration. The higher capacity furthermore, contributes to significantly lower power consumption by reducing heat losses that would otherwise by absorbed by structure within the reaction chamber that is not useful to the reaction process. The close proximity of the susceptor tube 17 to the wafers 14 provides for a more uniform temperature by radiation from the tube 17 throughout the substrates 14. More uniform temperature leads to better control of the thicknes of the material being deposited. Furthermore, the stack-like arrangement of the substrates 14 results in lower autodoping since the reactant gases flow only across one wafer in a single gas passage, that is, the passage defined by the spacings 19 between the substrates, and accordingly, do not repeatedly pass, as in other reactors, across the surfaces of substrates which are placed in a series-gas-flow reactor. Typically, prior art techniques operate with such undesirable laminar flow thereby causing autodoping of the substrate.

In certain applications the flow of gas can be made still more uniform by a further embodient of the manifold 32. As seen in FIG. 7, the manifold 32 is positioned within a shroud 120 of generally cylindrical form having an opening or nozzle throat 122 positioned to face generally towards the wafers 14 as shown in dotted lines. The nozzles 30 of the manifold 32 are oriented to face to a wall portion 124 of the shroud 120 to thereby provide a reflection surface for diffusing and reflecting the gaseous flow as shown by the dotted lines 126. The throat portion 122 may be a continuous slit throughout the longitudinal length of the manifold from the top to bottom wafer 14 whereby a ribbon-like pattern is passed into the region containing the wafers 14. Another embodiment of such structure provides for a series of shorter slots extending longitudinally with the manifold structure. For either embodiment, the oscillating motor 38 is suitably connected to the combined structure of the manifold 32 and the shroud 120 to oscillate the throat or slit 122 back and forth so as to project a flow of gas over the surfaces of the wafers 14.

A modified form of the susceptor 17 is shown in an end view in FIG. 5 as an octahedron 170 but any polyhedron may be used. Susceptor 170 is formed of eight elongated rectangular members 170a–170g of the same material as that of tubular susceptor 17 (FIG. 4). The longitudinal edges 171, 172, etc., may be joined to provide a seal in the wall. However, the edges may be spaced to provide an exhaust path for spent gases as shown at 173. Furthermore, slitted opening 112 is provided between members 170a and 170g to receive the gas distribution means 30 (FIG. 1) or 120 (FIG. 7). In this polygon form, susceptor 170 may be easier to manufacture than the cylindrical tube 17.

Further improvement in controlling the temperature of the gas flow to the wafer 14 can be achieved as shown in FIG. 7 by adjusting the space 179 between the gas manifold 120 and the susceptor 17 wall edge 180.

A particular advantage of the present invention is the increased production rate that can be achieved because of reduced down time of the reactor. The processed wafers are quickly removed and replaced with new wafers to be layered, since the rods 100–104 are substantially the only components within the reaction chamber 16 that may require cleaning. The rods are easily cleaned. In the prior art, susceptors within the reaction chamber required cleaning since the material to be deposited on the substrates is also undesirably deposited on the susceptors. According to the present invention, by having the heating-source susceptor in the form of the tube 17 essentially outside or remote activity of the gaseous material, very little, if any, material will be deposited on the inner walls of the tube 17. The outer walls of the tube 17 as well as the inner walls of the reaction chamber 18 should be relatively clear of deposited material. Furthermore, the rods 100–102 are easily removable from the chamber 16 and require, as indicated above, very little cleaning.

What is claimed is:

1. In a method of chemically vapor-depositing a material onto the surfaces of a plurality of substrates within a reaction chamber wherein said substrates are heated while contacting said surfaces with a gaseous compound of said material to be deposited, comprising the steps of:

positioning a tubular structure within said chamber to contain said substrates, said tubular structure having a wall formed of susceptor material selected from the group of susceptor materials consisting essentially of graphite and silicon carbide, said tubular structure of susceptor material serving as a radiant source of heat when heated to heat said substrates;

said susceptor material having the property of being inductively heated when exposed to radio frequency energy, supporting said substrates within said tubular structure in a stack-like arrangement wherein said surfaces are substantially parallel to each other;

directing a flow of gas to the surfaces of said substrates through a slitted opening in said tubular structure, and inductively heating said tubular structure by radio frequency energy to heat said substrates by radiant heat from said radio frequency heated tubular structure.

2. A method as recited in claim 1 further comprising the step of:
reducing the pressure of said gas within said chamber below atmospheric pressure.

3. A method according to claim 1 further comprising the step of stacking a pair of said substrates in a back-to-back manner so that only the exposed surfaces of each such stacked pair of substrates is deposited with said material.

4. A method according to claim 1 further comprising the step of:
oscillating said flow of gas back and forth over said substrate surfaces.

5. A method according to claim 1 further comprising the step of:
rotating said substrates each about its own axis.

* * * * *